(12) United States Patent
Watanabe (10) Patent No.: US 9,494,639 B2
(45) Date of Patent: Nov. 15, 2016

(54) INSPECTION APPARATUS (71) Applicant: FUJI XEROX CO., LTD., Tokyo (JP)

(72) Inventor: Hiroyasu Watanabe, Suzuka (JP)

(73) Assignee: FUJI XEROX CO., LTD., Tokyo (JP)

( * ) Notice: Subject to any disclaimer, the term of this patent is extended or adjusted under 35 U.S.C. 154(b) by 457 days.

(21) Appl. No.: 14/258,549

(22) Filed: Apr. 22, 2014

(65) Prior Publication Data

US 2015/0145542 A1    May 28, 2015

(30) Foreign Application Priority Data

Nov. 25, 2013  (JP) ................................. 2013-243171

(51) Int. Cl.
*G01R 31/28* (2006.01)
(52) U.S. Cl.
CPC ................. *G01R 31/2808* (2013.01)
(58) Field of Classification Search
CPC . G01R 1/0408; G01R 31/28; G01R 31/2808
USPC ..................................... 324/750.22
See application file for complete search history.

(56) References Cited

FOREIGN PATENT DOCUMENTS

JP    B1-4858657    1/2012

*Primary Examiner* — Melissa Koval
*Assistant Examiner* — Courtney McDonnough
(74) *Attorney, Agent, or Firm* — Oliff PLC (57) ABSTRACT

An inspection apparatus includes a first tester and a second tester each of which tests a substrate loaded therein, a first stage on which the first tester is mounted, the first stage being movable to a first loading and unloading position and a first test position, the first test position being provided above the first loading and unloading position, a second stage on which the second tester is mounted, the second stage being provided below the first stage and being movable to a second loading and unloading position and a second test position, the second test position being provided below the second loading and unloading position, and a lift mechanism that moves the first stage up and down to the first loading and unloading position and the first test position and moves the second stage up and down to the second loading and unloading position and the second test position.

7 Claims, 6 Drawing Sheets

INSPECTION APPARATUS

CROSS-REFERENCE TO RELATED APPLICATIONS

This application is based on and claims priority under 35 USC 119 from Japanese Patent Application No. 2013-243171 filed Nov. 25, 2013.

BACKGROUND

Technical Field

The present invention relates to an inspection apparatus.

SUMMARY

According to an aspect of the invention, there is provided an inspection apparatus including a first tester and a second tester in and from each of which a substrate is to be loaded and unloaded, the first tester and the second tester testing the loaded substrate, a first stage on which the first tester is mounted, the first stage being movable to a first loading and unloading position where the substrate is loaded in and unloaded from the first tester and a first test position where the first tester is located during a test of the substrate loaded at the first loading and unloading position, the first test position being provided above the first loading and unloading position, a second stage on which the second tester is mounted, the second stage being provided below the first stage and being movable to a second loading and unloading position where the substrate is loaded in and unloaded from the second tester and a second test position where the second tester is located during a test of the substrate loaded at the second loading and unloading position, the second test position being provided below the second loading and unloading position, and a lift mechanism that moves the first stage up and down to the first loading and unloading position and the first test position and moves the second stage up and down to the second loading and unloading position and the second test position.

BRIEF DESCRIPTION OF THE DRAWINGS

An exemplary embodiment of the present invention will be described in detail based on the following figures, wherein.

DETAILED DESCRIPTION

An exemplary embodiment of the present invention will be described below with reference to the drawings.

Inspection Apparatus 10 According to Exemplary Embodiment

Figure 1:
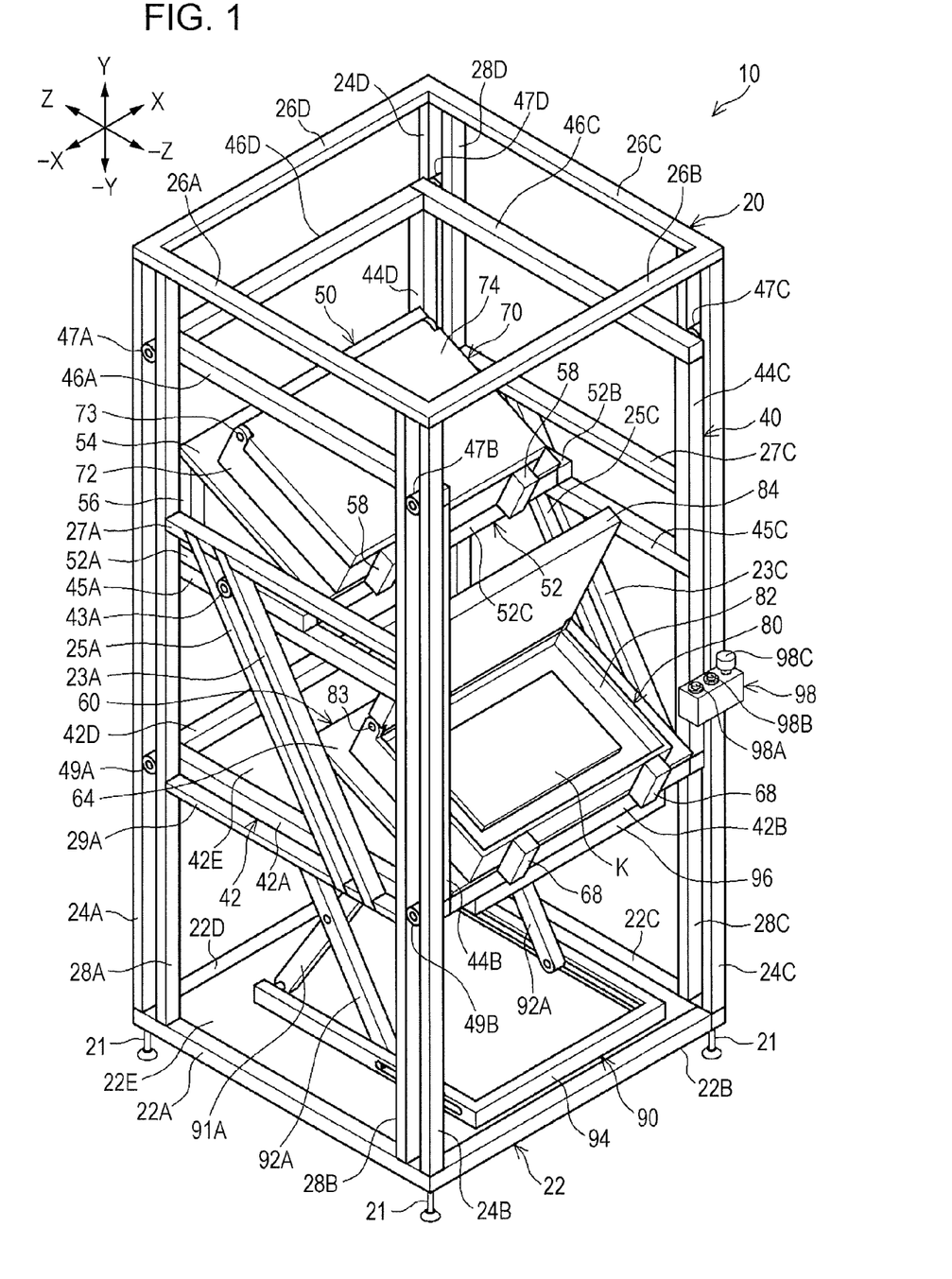
FIG. 1 is a perspective view illustrating a configuration of an inspection apparatus according to an exemplary embodiment.
Figure 2:
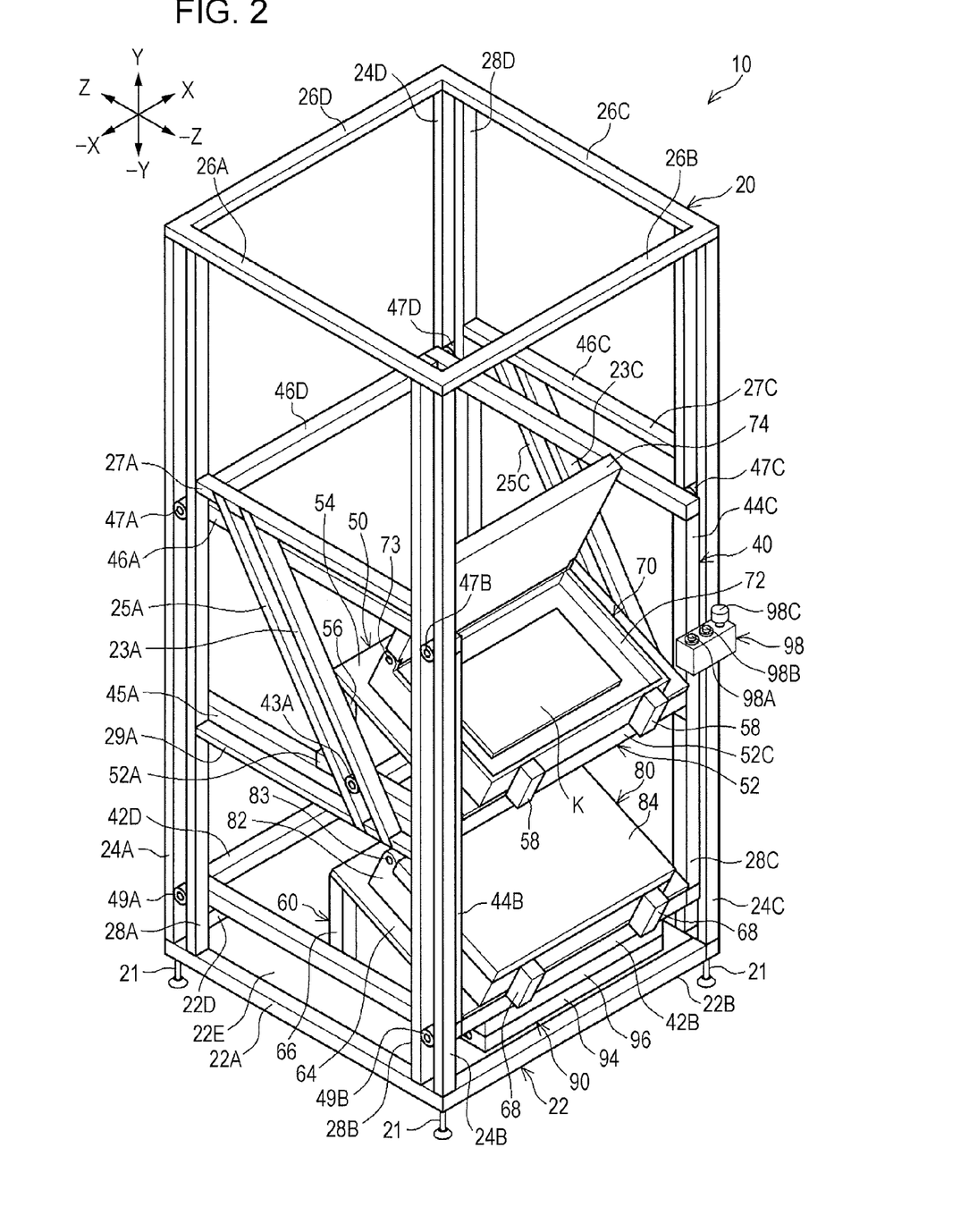
FIG. 2 is a perspective view illustrating a state in which a moving body is moved down in the configuration of FIG. 1.

First, a configuration of an inspection apparatus 10 according to the exemplary embodiment will be described. FIGS. 1 and 2 are perspective views illustrating the configuration of the inspection apparatus 10. FIGS. 3 to 6 are side views illustrating the configuration of the inspection apparatus 10. An X-direction, a −X-direction, a Y-direction (upward direction), a −Y-direction (downward direction), a Z-direction, and a −Z-direction used in the following description are directions of arrows shown in the drawings. In each of the drawings, an encircled cross represents an arrow pointing from the front side of the paper of the drawing to the back side, and an encircled dot represents an arrow pointing from the back side of the plane of the drawing to the front side. Further, in FIGS. 3 to 6, a movable part (moving body 40) in the inspection apparatus 10 is dotted for easy understanding.

As illustrated in FIG. 1, the inspection apparatus 10 includes a body frame 20, and a moving body 40 disposed within the body frame 20 to be movable in upward and downward directions (Y- and −Y-directions) relative to the body frame 20. The inspection apparatus 10 further includes a first tester 70 disposed in an upper part of the moving body 40, a second tester 80 disposed in a lower part of the moving body 40, and a lift 90 (an example of a lift mechanism) disposed below (on a −Y-direction side of) the moving body 40 to move the moving body 40 up and down.

The first tester 70 and the second tester 80 each conduct an electrical test on a substrate K (circuit board). For example, the electrical test is an in-circuit test or a functional test. Specifically, the first tester 70 and the second tester 80 include tester bodies 72 and 82 and openable and closable lid portions 74 and 84 disposed in upper parts of the tester bodies 72 and 82, respectively. The lid portions 74 and 84 are supported by support portions (hinges) 73 and 83 at Z-direction ends of the tester bodies 72 and 82, respectively. Thus, the lid portions 74 and 84 are opened by turning −Z-direction ends thereof upward (in the Y-direction) about Z-direction ends. The lid portions 74 and 84 are closed from the open state by turning the −Z-direction ends thereof downward (−Y-direction) about the Z-direction ends.

The tester bodies 72 and 82 are box-shaped, and upper parts thereof are open with the lid portions 74 and 84 being open, respectively. Substrates K to be inspected are loaded in and unloaded from the upper parts of the tester bodies 72 and 82. After being loaded in the tester bodies 72 and 82, the substrates K are subjected to an electrical test in a state in which the lid portions 74 and 84 are closed.

The tester bodies 72 and 82 are provided with operating portions (not illustrated) used to start the test. An operator performs an operation of loading and unloading the substrates K into and from the first tester 70 and the second tester 80 while facing a −Z-direction side surface of the inspection apparatus 10.

The body frame 20 is a fixed section in the inspection apparatus 10, and includes a platelike bottom portion 22, four columns 24A, 24B, 24C, and 24D (hereinafter referred to as columns 24A to 24D) standing upward from four corners of the bottom portion 22, and four beams 26A, 26B, 26C, and 26D that connect upper end portions of the four columns 24A to 24D.

The bottom portion 22 is a portion on which the lift 90 is mounted, and includes a quadrangular bottom plate 22E, and four bottom beams 22A, 22B, 22C, and 22D (hereinafter referred to as bottom beams 22A to 22D) that surround the bottom plate 22E to form a frame. The four bottom beams 22A to 22D are supported at four corners by leg portions 21 on a floor surface (not illustrated) on which the inspection apparatus 10 is installed.

Specifically, the columns 24A to 24D stand upward from the corners where the four bottom beams 22A to 22D are connected. In a Z-direction side portion of the bottom beam 22A, an opposed column 28A stands opposed to the column 24A with a space therebetween such that below-described rollers 47A and 49A can be disposed in the space. In a −Z-direction side portion of the bottom beam 22A, an opposed column 28B stands opposed to the column 24B with a space therebetween such that below-described rollers 47B and 49B can be disposed in the space. Upper end portions of the opposed columns 28A and 28B are connected to the beam 26A.

In a −Z-direction side portion of the bottom beam 22C, an opposed column 28C stands opposed to the column 24C with a space therebetween such that a below-described roller 47C can be disposed in the space. In a Z-direction side portion of the bottom beam 22C, an opposed column 28D stands opposed to the column 24D with a space therebetween such that a below-described roller 47D can be disposed in the space. Upper end portions of the opposed columns 28C and 28D are connected to the beam 26C.

A pair of upper and lower beams 27A and 29A are disposed between vertically intermediate portions of the opposed columns 28A and 28B to connect the opposed columns 28A and 28B. Between the upper beam 27A and the lower beam 29A, a pair of front and rear rail members 23A and 25A are disposed to diagonally connect the upper beam 27A and the lower beam 29A. The rail members 23A and 25A are connected at lower ends to a −Z-direction side of the lower beam 29A, and are connected at upper ends to a Z-direction side of the upper beam 27A. That is, the rail members 23A and 25A are inclined to gradually shift in the Z-direction as they extend upward. Thus, the rail members 23A and 25A guide a below-described roller 43A such that the roller 43A gradually shifts in the Z-direction as it moves upward.

A pair of an upper beam 27C and a lower beam (not illustrated) are disposed between vertically intermediate portions of the opposed columns 28C and 28D to connect the opposed columns 28C and 28D. The lower beam is disposed on an X-direction side to be opposed to the lower beam 29A. Between the upper beam 27C and the lower beam, a pair of front and rear rail members 23C and 25C are disposed to diagonally connect the upper beam 27C and the lower beam. The rail members 23C and 25C are connected at lower ends to a −Z-direction side of the lower beam, and are connected at upper ends to a Z-direction side of the upper beam 27C. That is, the rail members 23C and 25C are inclined to gradually shift in the Z-direction as they extend upward. Thus, the rail members 23C and 25C guide a roller (not illustrated) disposed on a side (X-direction side) opposite from the below-described roller 43A such that the roller gradually shifts in the Z-direction as it moves upward.

The moving body 40 is a movable section of the inspection apparatus 10, and is movable in the up-down direction (Y- and −Y-directions) relative to the body frame 20 serving as the fixed section of the inspection apparatus 10 while being housed in an inner space of the body frame 20. Specifically, the moving body 40 includes a platelike bottom portion 42, four columns 44A, 44B, 44C, and 44D (hereinafter referred to as columns 44A to 44D) standing upward (in the Y-direction) from four corners of the bottom portion 42, and three beams 46A, 46C, and 46D that connect upper end portions of the four columns 44A to 44D.

The bottom portion 42 includes a quadrangular bottom plate 42E, and four bottom beams 42A, 42B, 42C, and 42D (hereinafter referred to as bottom beams 42A to 42D) that surround the bottom plate 42E to form a frame. Specifically, the four columns 44A to 44D stand upward (in the Y-direction) from the corners where the four bottom beams 42A to 42D are connected.

Between the columns 44A and 44B, a connecting beam 45A is provided to connect vertically intermediate portions of the columns 44A and 44B in the Z-direction. Between the columns 44C and 44D, a connecting beam 45C is provided to connect vertically intermediate portions of the columns 44C and 44D in the Z-direction.

A first stage 50 on which the first tester 70 is mounted is provided on the connecting beam 45A and the connecting beam 45C to be movable in the Z-direction. The first stage 50 includes a moving member 52 movable in the Z-direction relative to the connecting beams 45A and 45C and angular U-shaped in plan view, and a mount plate 54 on which the first tester 70 is mounted.

The moving member 52 includes a rodlike moving portion 52A disposed on the connecting beam 45A to be movable in the Z-direction and having a length in the Z-direction, a rodlike moving portion 52B disposed on the connecting beam 45C to be movable in the Z-direction and having a length in the Z-direction, and a connecting portion 52C that connects a −Z-direction side portion of the moving portion 52A and a −Z-direction side portion of the moving portion 52B.

The mount plate 54 is rectangular, and a −Z-direction end portion thereof is fixed to the connecting portion 52C of the moving member 52. The mount plate 54 is inclined such that a Z-direction end portion thereof is disposed at a position higher than the −Z-direction end portion. The Z-direction end portion of the mount plate 54 is supported by support members 56 that stand upward (in the Y-direction) from the connecting beams 45A and 45C. The −Z-direction end portion of the mount plate 54 is provided with restricting members 58 that restrict the first tester 70 mounted on the mount plate 54 from moving (falling) in the −Z-direction.

Further, a second stage 60 on which the second tester 80 is mounted is provided on the bottom plate 42E of the bottom portion 42. The second stage 60 includes a mount plate 64 on which the second tester 80 is mounted. The mount plate 64 is rectangular, and a −Z-direction end portion thereof is fixed to the bottom beam 42B of the moving body 40. The mount plate 64 is inclined such that a Z-direction end portion thereof is disposed at a position higher than the −Z-direction end portion. The Z-direction end portion of the mount plate 64 is supported by two support members 66 (see FIGS. 2 and 3) standing upward (in the Y-direction) from the bottom plate 42E of the moving body 40. The −Z-direction end portion of the mount plate 64 is provided with restricting members 68 that restrict the second tester 80 mounted on the mount plate 64 from moving (falling) in the −Z-direction.

In this way, in the exemplary embodiment, the first tester 70 is mounted on the first stage 50, and the second tester 80 is mounted on the second stage 60 located below the first stage 50. Thus, the first tester 70 and the second tester 80 are arranged in the up-down direction. This makes the installation area (occupation area) of the inspection apparatus 10 smaller than when the first tester 70 and the second tester 80 are arranged in a horizontal direction.

Since the first tester 70 and the second tester 80 are set in an inclined state on the inclined mount plates 54 and 64, respectively, the occupation areas of the first tester 70 and the second tester 80 are smaller than when the first tester 70 and the second tester 80 are oriented in the horizontal direction.

Further, since the first tester 70 and the second tester 80 are set in an inclined state such that upper surfaces thereof face toward the operator, substrates K can be easily loaded in and unloaded from the first tester 70 and the second tester 80.

In the exemplary embodiment, a roller 47A disposed between the column 24A and the opposed column 28A and a roller 47B disposed between the column 24B and the opposed column 28B are provided in a Z-direction end portion and a −Z-direction end portion of a side surface of the beam 46A of the moving body 40, respectively. That is, the opposed column 28A and the opposed column 28B are held between the roller 47A and the roller 47B.

A roller 49A disposed between the column 24A and the opposed column 28A and a roller 49B disposed between the column 24B and the opposed column 28B are provided in a Z-direction end portion and a −Z-direction end portion of a side surface of the bottom beam 42A of the moving body 40, respectively. That is, the opposed column 28A and the opposed column 28B are held between the roller 49A and the roller 49B.

A roller 47C disposed between the column 24C and the opposed column 28C and a roller 47D disposed between the column 24D and the opposed column 28D are provided in a −Z-direction end portion and a Z-direction end portion of a side surface of the beam 46C of the moving body 40, respectively. That is, the opposed column 28C and the opposed column 28D are held between the roller 47C and the roller 47D.

A roller (not illustrated) disposed between the column 24C and the opposed column 28C and a roller (not illustrated) disposed between the column 24D and the opposed column 28D are provided in a −Z-direction end portion and a Z-direction end portion of a side surface of the bottom beam 42C of the moving body 40, respectively. That is, the opposed column 28C and the opposed column 28D are held between these rollers.

The rollers 47A, 47B, 47C, 47D, 49A, 49B, and so on are guided between the columns 24A to 24D and the opposed columns 28A to 28D. This allows the moving body 40 to move in the up-down direction (Y- and −Y-directions) relative to the body frame 20. The first stage 50 provided in the moving body 40 is movable to a first loading and unloading position where a substrate K is loaded in and unloaded from the first tester 70 (a position illustrated in FIGS. 2, 5, and 6) and a first test position where the first tester 70 is positioned during a test of the substrate K loaded at the first loading and unloading position (a position illustrated in FIGS. 1, 3, and 4). The first test position is set above the first loading and unloading position.

Figure 4:
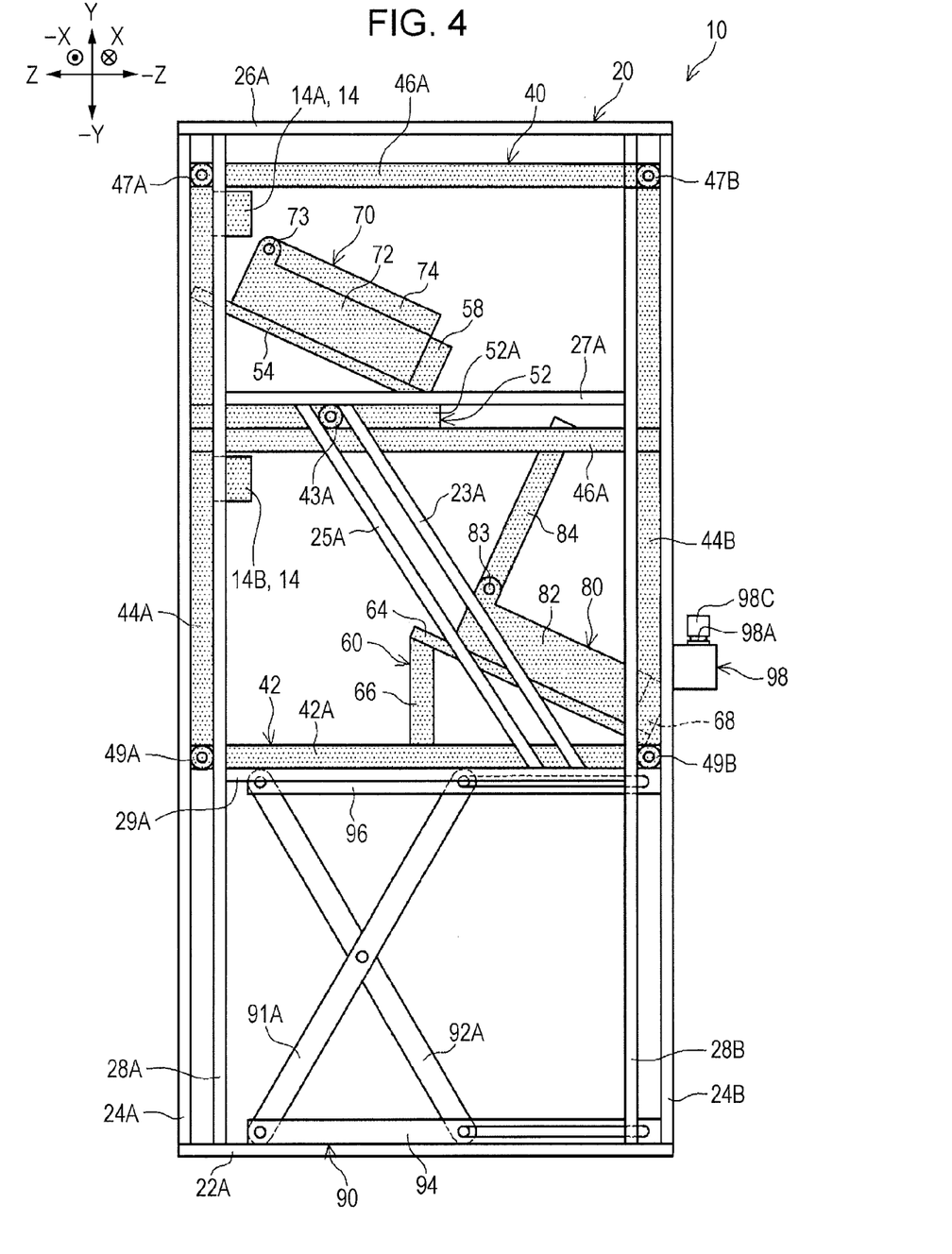
FIG. 4 is a side view illustrating a state in which a lid portion of a second tester is open in the configuration of FIG. 3.
Figure 5:
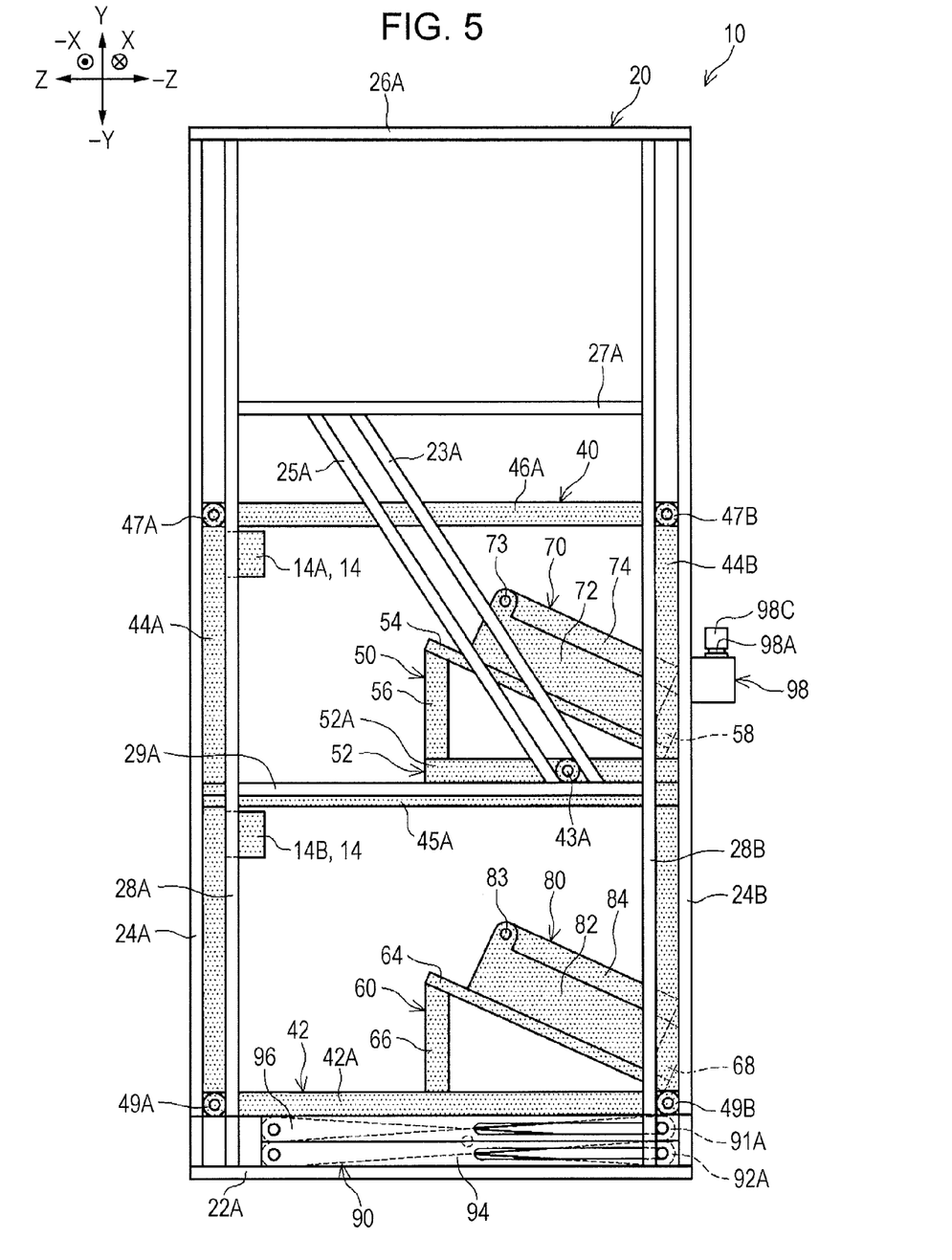
FIG. 5 is a side view illustrating a state in which the moving body is moved down in the configuration of FIG. 3.
Figure 6:
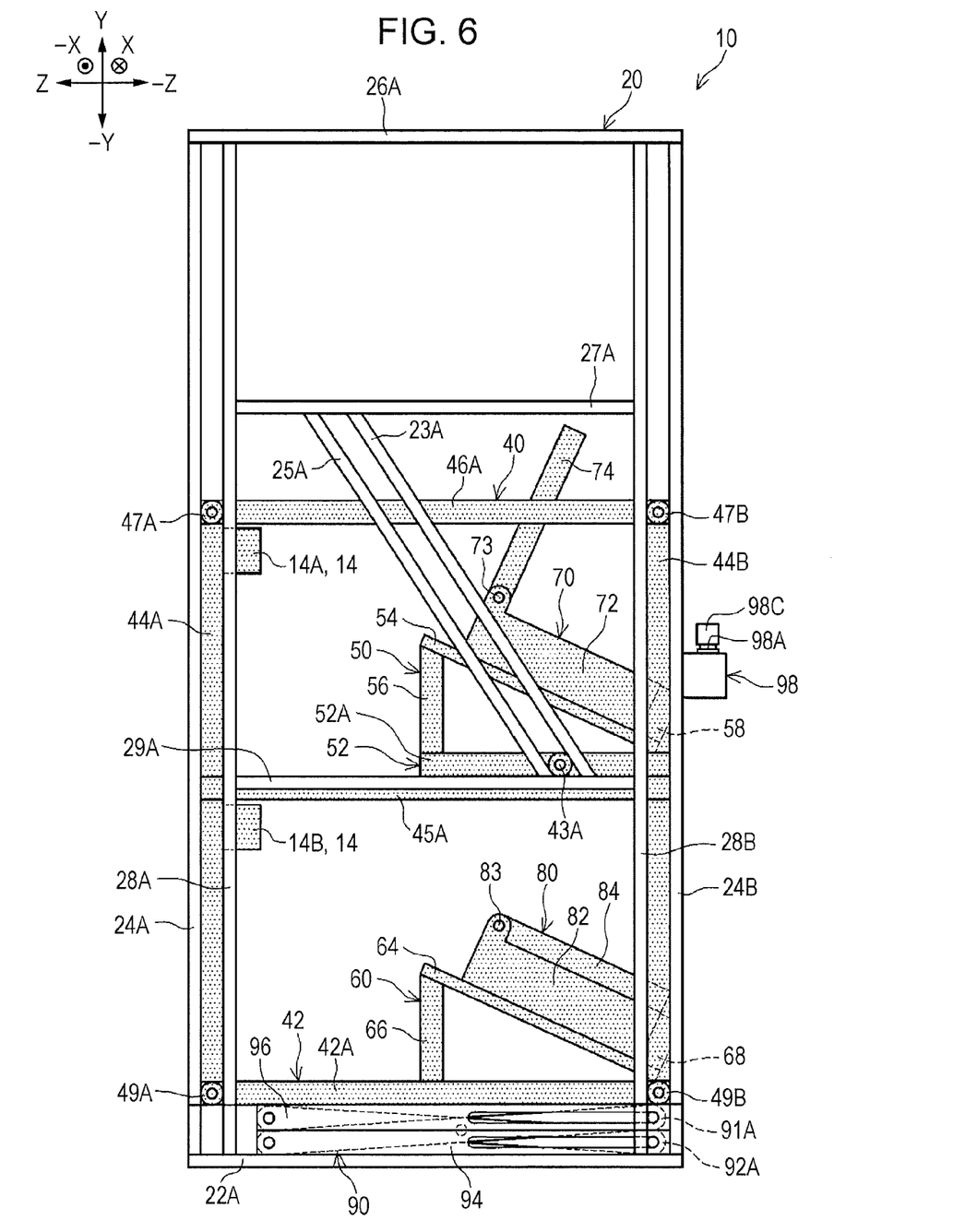
FIG. 6 is a side view illustrating a state in which a lid portion of a first tester is open in the configuration of FIG. 5.

The second stage 60 is movable to a second loading and unloading position where a substrate K is loaded in and unloaded from the second tester 80 (a position illustrated in FIGS. 1, 3, and 4) and a second test position where the second tester 80 is positioned during a test of the substrate K loaded at the second loading and unloading position (a position illustrated in FIGS. 2, 5, and 6). The second test position is set below the second loading and unloading position.

In the exemplary embodiment, since the first stage 50 and the second stage 60 are provided in a single structure (moving body 40), they move (shift) together. Therefore, in the exemplary embodiment, in a state in which the first stage 50 is located at the first loading and unloading position, the second stage 60 is located at the second test position. In contrast, in a state in which the first stage 50 is located at the first test position, the second stage 60 is located at the second loading and unloading position.

Further, in the exemplary embodiment, a roller 43A disposed between the pair of rail members 23A and 25A and a roller (not illustrated) disposed between the rail members 23C and 25C are provided on a side surface of the moving portion 52A and a side surface of the moving portion 52B, respectively, in the moving member 52 of the first stage 50.

Thus, the first stage 50 gradually shifts in the Z-direction as it moves up, and gradually shifts in the −Z-axis direction as it moves down. The first test position (position illustrated in FIGS. 1, 3, and 4) is a position where the first stage 50 is withdrawn in the Z-direction from the open lid portion 84 of the second tester 80. That is, the first stage 50 withdraws to a position with which the open lid portion 84 of the second tester 80 does not interfere.

The lift 90 (an example of a lift mechanism) is a device that moves the first stage 50 up and down to the first test position and the first loading and unloading position, and moves the second stage 60 up and down to the second loading and unloading position and the second test position. Specifically, the lift 90 includes two pairs of link members 91A and 92A whose longitudinal center portions are turnably connected in an X form in side view (viewed from direction X), a bottom portion 94 to which lower end portions of the link members 91A and 92A are connected, and a lift-up portion 96 to which upper end portions of the link members 91A and 92A are connected.

The two link members 91A are disposed opposed to each other, and the two link members 92A are similarly disposed opposed to each other. One of the two link members 91A is not illustrated.

Specifically, the bottom portion 94 supports the lower end portions of the two link members 91A turnably, and supports the lower end portions of the two link members 92A turnably and movably in the −Z-direction (Z-direction).

Specifically, the lift-up portion 96 supports the upper end portions of the two link members 92A turnably, and supports the upper end portions of the two link members 91A turnably and movably in the −Z-direction (Z-direction).

The lift-up portion 96 moves up when the link members 91A and 92A are raised by a driving unit (not illustrated) such that the distance between the upper end portions of the link members 91A and the upper end portions of the link members 92A decreases. The moving body 40 is thereby lifted such that the first stage 50 is positioned at the first test position and the second stage 60 is positioned at the second loading and unloading position.

The lift-up portion 96 moves down when the link members 91A and 92A are tilted by the driving unit (not illustrated) such that the distance between the upper end portions of the link members 91A and the upper end portions of the link members 92A increases. The moving body 40 is thereby lowered such that the first stage 50 is positioned at the first loading and unloading position and the second stage 60 is positioned at the second test position.

The column 24C of the body frame 20 is provided with an operating unit 98 used to operate the lift 90. The operating unit 98 includes a first operation button 98A, a second operation button 98B, and a third operation button 98C.

In a stopped state in which the first stage 50 is located at the first loading and unloading position (a stopped state in which the second stage 60 is located at the second test position), when the first operation button 98A is operated, the lift-up portion 96 of the lift 90 moves up to move the first stage 50 to the first test position (to move the second stage 60 to the second loading and unloading position).

In a stopped state in which the first stage 50 is located at the first test position (a stopped state in which the second stage 60 is located at the second loading and unloading position), when the first operation button 98A is operated, the lift-up portion 96 of the lift 90 moves down to move the first stage 50 to the first loading and unloading position (to move the second stage 60 to the second test position).

When the second operation button 98B is operated in a state in which the moving body 40 (first stage 50 and second stage 60) is moving up (or moving down), the moving body 40 moves down (or moves up). The third operation button 98C is an emergency stop operation button. When the third operation button 98C is operated in a state in which the moving body 40 (first stage 50 and second stage 60) is moving up or down, the movement is stopped.

Figure 3:
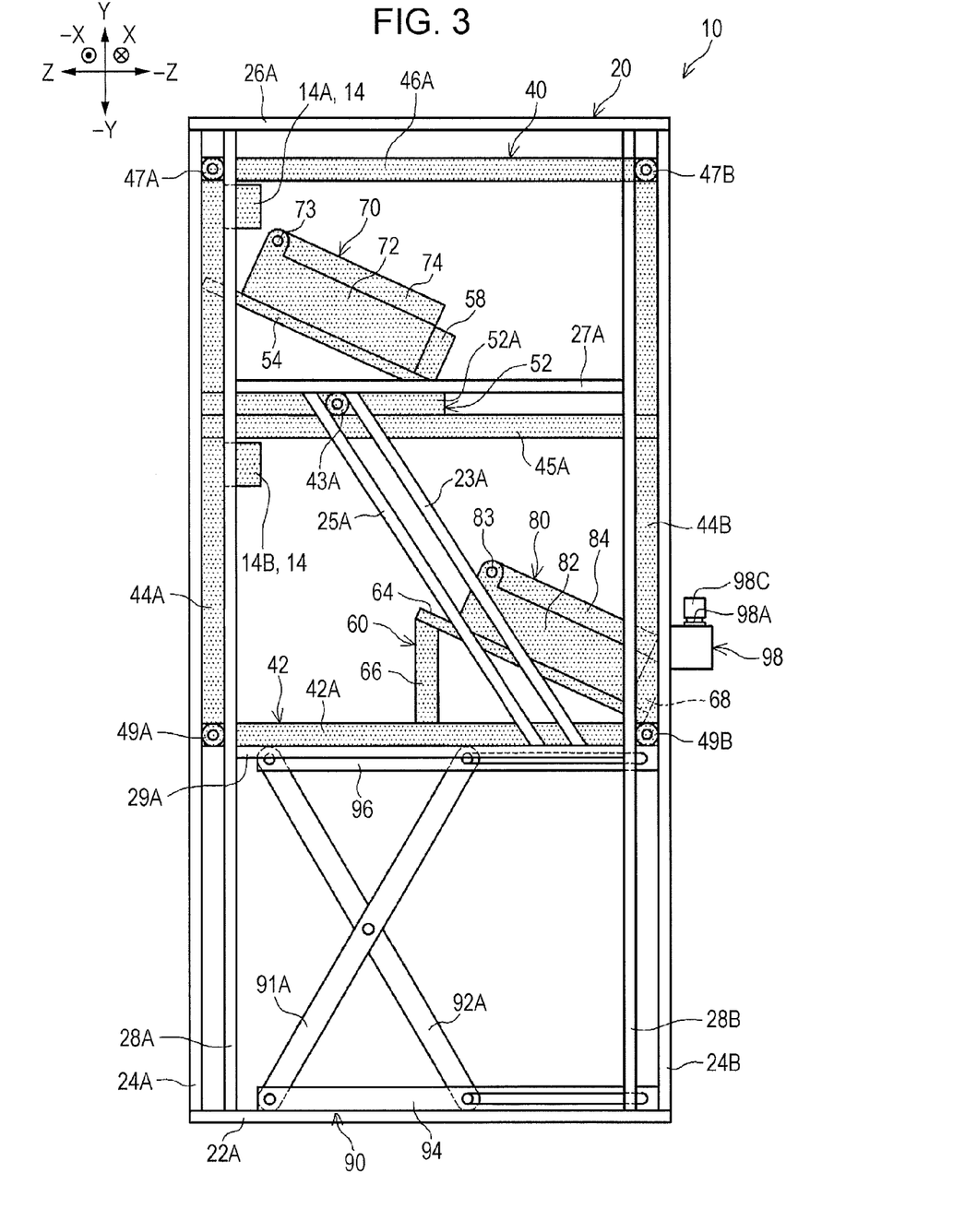
FIG. 3 is a side view illustrating the configuration of the inspection apparatus according to the exemplary embodiment.

As illustrated in FIG. 3, the inspection apparatus 10 further includes a display 14 that displays test states (test situations) and test results of the first tester 70 and the second tester 80. Specifically, the display 14 includes a first display unit 14A that displays a test state of the first tester 70, and a second display unit 14B that displays a test state of the second tester 80. The display 14 is not illustrated in FIGS. 1 and 2.

For example, the first display unit 14A and the second display unit 14B are disposed on rear sides of the first tester 70 and the second tester 80, respectively, and are fixed to the column 44A. Display screens (display portions) of the first display unit 14A and the second display unit 14B face toward the −Z-direction side such that the operator facing a −Z-direction side surface of the inspection apparatus 10 can view the display screens. The positions and orientations (tilts) of the first display unit 14A and the second display unit 14B are adjusted so that the operator can view the display screens even when the positions of the moving body 40 is changed by upward or downward movement. That is, the first display unit 14A and the second display unit 14B are visible to the operator when the first stage 50 is located at any of the first test position and the first loading and unloading position (when the second stage 60 is located at any of the second loading and unloading position and the second test position).

For example, the first display unit 14A and the second display unit 14B display whether test operations in the first tester 70 and the second tester 80 are being performed or are finished (stopped). For example, the first display unit 14A and the second display unit 14B display whether test results of the substrates K in the first tester 70 and the second tester 80 are good or not good. Therefore, the operator performs an unloading operation of the substrate K and a moving operation of the lift 90 on the basis of the display according to a below-described test procedure. A single display may display test states (test situations) and test results of the first tester 70 and the second tester 80.

Test Procedure (Test Method) Using Inspection Apparatus 10

Next, an example of a test procedure using the inspection apparatus 10 will be described in conjunction with the operation of the exemplary embodiment. In the description, it is assumed that the first stage 50 is first located at the first test position and the second stage 60 is located at the second loading and unloading position (a state illustrated in FIG. 3).

In the test procedure, as illustrated in FIG. 4, the operator first opens the lid portion 84 of the second tester 80 on the second stage 60 that is located at the second loading and unloading position. Next, the operator loads a substrate K from the open upper part into the tester body 82 of the second tester 80, and closes the lid portion 84. Then, the operator starts a test by operating the operating portion (not illustrated) of the tester body 82.

Next, when the operator operates the first operation button 98A of the operating unit 98 provided on the body frame 20, the moving body 40 moves down, as illustrated in FIG. 5. Thus, the first stage 50 is located at the first loading and unloading position, and the second stage 60 is located at the second test position. At this time, the test of the substrate K is being carried out in the second tester 80.

Next, as illustrated in FIG. 6, the operator opens the lid portion 74 of the first tester 70 on the first stage 50 that is located at the first loading and unloading position. Subsequently, the operator loads a substrate K from the open upper part into the tester body 72 of the first tester 70, and closes the lid portion 74. Then, the operator starts a test by operating the operating portion (not illustrated) of the tester body 72.

Next, when the operator operates the first operation button 98A of the operating unit 98 provided on the body frame 20, the moving body 40 moves up, as illustrated in FIG. 3. Thus, the first stage 50 is located at the first test position, and the second stage 60 is located at the second loading and unloading position. At this time, the test of the substrate K is being carried out in the first tester 70. When confirming, on the second display unit 14B, completion of the test of the substrate K in the second tester 80, the operator opens the lid portion 84 of the second tester 80, takes out the tested substrate K, puts the nest substrate K to be tested into the tester body 82, and closes the lid portion 84. The operator starts a test again by operating the operating portion (not illustrated) of the tester body 82.

By repeating the above-described procedure, the substrates K are tested in the first tester 70 and the second tester 80.

For example, in a case in which a test starts in the first tester 70 after a test starts in the second tester 80, if a defect of the substrate K is found in the first tester 70 immediately after the start of the test, the test in the first tester 70 is sometimes finished before the test in the second tester 80 is finished. That is, the order in which the tests in the first tester 70 and the second tester 80 are finished is not relevant to the order in which the tests start in the first tester 70 and the second tester 80. Therefore, the operator confirms, on the first display unit 14A and the second display unit 14B, which of the first tester 70 and the second tester 80 finished the test earlier. Then, the operator moves, to the loading and unloading position (first loading and unloading position or second loading and unloading position), the stage (first stage 50 or second stage 60) on which the test was finished earlier, and then performs an operation of unloading and loading substrates K (replacing operation).

Modifications

While the first stage 50 and the second stage 60 move up and down together while being provided in the single moving body 40 in the above-described exemplary embodiment, the present invention is not limited thereto. The first stage 50 and the second stage 60 may be separately provided to independently move up and down. In this case, lifts for respectively moving the first stage 50 and the second stage 60 are necessary.

While the mount plate 54 of the first stage 50 and the mount plate 64 of the second stage 60 are inclined in the above exemplary embodiment, the present invention is not limited thereto. The mount plate 54 and the mount plate 64 may be disposed along the horizontal direction such that the first tester 70 and the second tester 80 are oriented in the horizontal direction.

While the lid portions 74 and 84 of the first and second testers 70 and 80 are opened and closed by being turned in the above exemplary embodiment, the present invention is not limited thereto. For example, the lid portions 74 and 84 may be opened by being slid upward.

While the first stage 50 withdraws in the Z-direction so as not to interfere with the lid portion 84 of the second tester 80 in the above exemplary embodiment, the present invention is not limited thereto. For example, the first stage 50 may withdraw in the X-direction or the −X-direction. Alternatively, the first stage 50 may withdraw upward with a distance from the second tester 80 such as not to interfere with the lid portion 84 of the second tester 80.

While the operating unit 98 for moving the moving body 40 up and down and the operating portions for starting tests of the first tester 70 and the second tester 80 are separately provided in the above exemplary embodiment, the present invention is not limited thereto.

For example, the operating unit 98 may perform both the operation of starting the tests and the operation for moving the moving body 40 up and down. Specifically, for example, when an operation of starting a test of a substrate K in the second tester 80 is performed by the operating unit 98, the second stage 60 is moved down to the second test position. According to this structure, the operation of moving the second stage 60 down may be omitted.

Further, when an operation of starting a test of a substrate K in the first tester 70 is performed by the operating unit 98, the first stage 50 is moved up to the first test position. According to this structure, the operation of moving the first stage 50 up may be omitted.

The present invention is not limited to the above-described exemplary embodiment, and various modifications, changes, and improvements can be made. For example, plural ones of the above-described modifications may be combined.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An inspection apparatus comprising:
    a first tester and a second tester in and from each of which a substrate is to be loaded and unloaded, the first tester and the second tester testing the loaded substrate;
    a first stage on which the first tester is mounted, the first stage being movable to a first loading and unloading position where the substrate is loaded in and unloaded from the first tester and a first test position where the first tester is located during a test of the substrate loaded at the first loading and unloading position, the first test position being provided above the first loading and unloading position;
    a second stage on which the second tester is mounted, the second stage being provided below the first stage and being movable to a second loading and unloading position where the substrate is loaded in and unloaded from the second tester and a second test position where the second tester is located during a test of the substrate loaded at the second loading and unloading position, the second test position being provided below the second loading and unloading position; and
    a lift mechanism that moves the first stage up and down to the first loading and unloading position and the first test position and moves the second stage up and down to the second loading and unloading position and the second test position.

2. The inspection apparatus according to claim 1,
    wherein the second tester includes a lid portion that is opened by moving toward the first stage when the substrate is loaded, and
    wherein the first test position is a position to which the first stage withdraws from the opened lid portion.

3. The inspection apparatus according to claim 1,
    wherein the lift mechanism moves the first stage and the second stage upward together, respectively, to the first test position and the second loading and unloading position, and
    wherein the lift mechanism moves the first stage and the second stage downward together, respectively, to the first loading and unloading position and the second test position.

4. The inspection apparatus according to claim 2,
    wherein the lift mechanism moves the first stage and the second stage upward together, respectively, to the first test position and the second loading and unloading position, and
    wherein the lift mechanism moves the first stage and the second stage downward together, respectively, to the first loading and unloading position and the second test position.

5. The inspection apparatus according to claim 1,
    wherein the lift mechanism moves the first stage upward to the first test position when an operation of starting the test of the substrate in the first tester is performed.

6. The inspection apparatus according to claim 1,
    wherein the lift mechanism moves the second stage downward to the second test position when an operation of starting the test of the substrate in the second tester is performed.

7. The inspection apparatus according to claim 1, further comprising:
    a display that displays ends of the tests in the first tester and the second tester,
    wherein the lift mechanism moves the tester that finishes the test earlier, of the first tester and the second tester, upward or downward to the loading and unloading position of the tester, regardless of which of the first tester and the second tester starts the test earlier.

* * * * *